(12) United States Patent
Park et al.

(10) Patent No.: US 11,832,385 B2
(45) Date of Patent: Nov. 28, 2023

(54) CIRCUIT BOARD

(71) Applicant: DONGWOO FINE-CHEM CO., LTD., Iksan-si (KR)

(72) Inventors: Ki Joon Park, Hwaseong-si (KR); Sung Jin Noh, Hanam-si (KR); Jungu Lee, Suwon-si (KR)

(73) Assignee: DONGWOO FINE-CHEM CO., LTD., Iksan-si (KR)

(*) Notice: Subject to any disclaimer, the term of this patent is extended or adjusted under 35 U.S.C. 154(b) by 0 days.

(21) Appl. No.: 17/554,101

(22) Filed: Dec. 17, 2021

(65) Prior Publication Data

US 2022/0210915 A1 Jun. 30, 2022

(30) Foreign Application Priority Data

Dec. 24, 2020 (KR) .................. 10-2020-0183407
Oct. 18, 2021 (KR) .................. 10-2021-0138564

(51) Int. Cl.
| | | |
|---|---|---|
| H05K 1/09 | (2006.01) | |
| H05K 1/02 | (2006.01) | |
| H05K 1/11 | (2006.01) | |
| H05K 1/18 | (2006.01) | |
| H01L 33/62 | (2010.01) | |
| H05K 1/03 | (2006.01) | |
| H01L 25/075 | (2006.01) | |

(52) U.S. Cl.
CPC .............. *H05K 1/09* (2013.01); *H01L 33/62* (2013.01); *H05K 1/0271* (2013.01); *H01L 25/075* (2013.01); *H05K 1/0306* (2013.01); *H05K 1/111* (2013.01); *H05K 1/18* (2013.01); *H05K 2201/0326* (2013.01); *H05K 2201/0341* (2013.01); *H05K 2201/10106* (2013.01)

(58) Field of Classification Search
CPC ...... H05K 1/09; H05K 1/0271; H05K 1/0306; H05K 1/18; H05K 2201/0326; H05K 2201/0341; H05K 2201/10106; H05K 3/16; H05K 3/181; H05K 3/188; H05K 3/388; H01L 33/62; H01L 25/075; Y02E 10/549

See application file for complete search history.

(56) References Cited

U.S. PATENT DOCUMENTS

| | | | | |
|---|---|---|---|---|
| 10,660,202 | B1* | 5/2020 | Yeh .................. | H05K 1/115 |
| 2011/0261847 | A1* | 10/2011 | Chou ................ | H01L 25/0753 |
| | | | | 257/91 |
| 2017/0347450 | A1* | 11/2017 | Park .................. | H05K 3/422 |
| 2019/0269013 | A1* | 8/2019 | Takagi ............... | H01G 4/228 |
| 2020/0273763 | A1 | 8/2020 | Tsuchida | |

FOREIGN PATENT DOCUMENTS

| | | | |
|---|---|---|---|
| CN | 106795044 A | | 5/2017 |
| JP | WO2018/101468 A1 | * | 6/2018 |
| JP | 2019114635 A | * | 7/2019 |
| KR | 10-2019-0003025 A | | 1/2019 |
| TW | 201344316 A | | 11/2013 |
| TW | 201834514 A | | 9/2018 |

* cited by examiner

Primary Examiner — Ishwarbhai B Patel
(74) *Attorney, Agent, or Firm* — Sughrue Mion, PLLC

(57) ABSTRACT

A circuit board includes a base layer, a seed layer formed on the base layer, and a first electrode layer formed on the seed layer. The seed layer is formed of a metal oxide with a thickness of 100 to 400 Å. The circuit board may further include an insulation layer formed on the first electrode layer and a second electrode layer formed on the insulation layer.

3 Claims, 1 Drawing Sheet

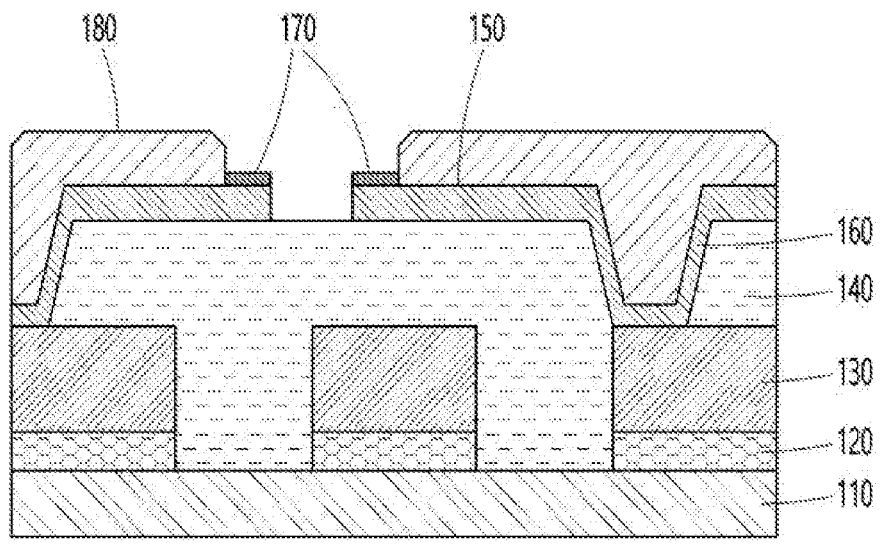

CIRCUIT BOARD

CROSS REFERENCE TO RELATED APPLICATIONS

The instant application claims priority based on Korean Patent Application No. 10-2020-0183407 filed Dec. 24, 2020 and Korean Patent Application No. 10-2021-0138564 filed Oct. 18, 2021, the entire contents of which are hereby incorporated by reference.

TECHNICAL FIELD

The present invention relates to a circuit board. Particularly, the present invention relates to a circuit board capable of increasing the adhesion between an electrode layer and a glass substrate layer when the metal electrode layer is formed on the glass substrate layer and blocking the lifting or warpage of the glass substrate layer in the edge or vertex region when the glass substrate layer is formed in a large size.

BACKGROUND ART

Glass circuit boards using glass as a base layer are widely used in expensive products such as LCD panels, organic light emitting diode (OLED) panels, and so on.

The glass circuit board includes a glass substrate layer, a metal electrode layer formed on the glass substrate layer, and the like. However, the glass circuit board has a problem in that the metal electrode layer formed on the glass substrate layer does not firmly adhere to the glass substrate layer due to the characteristics of the glass material.

Korean Patent Application Publication No. 10-2019-0003025 uses a photosensitive glass process to configure an electrode as a through electrode, that is, an upper electrode and a lower electrode, thereby preventing thermal deformation of the glass substrate layer and increasing the adhesion of the electrode. Korean Patent Application Publication No. 10-2019-0003025 also suggests a method of forming a seed layer first and then forming the electrode layer thereon in order to increase the adhesion of the electrode. Here, the seed layer is composed of a multilayer film of titanium/copper.

However, in Korean Patent Application Publication No. 10-2019-0003025, the through electrode may damage the glass substrate layer because it is necessary to heat the glass substrate layer or apply a physical force to the glass substrate layer. The method of additionally forming the seed layer is a configuration that can be contemplated; however, if the multilayer film of titanium/copper is formed as the seed layer, lifting or bending of the glass substrate layer can be alleviated to some extent, but there is a limit in increasing the adhesion.

DISCLOSURE OF INVENTION

Technical Problem

The present invention is to solve the problems of the prior art, and an object of the present invention is to prevent the lifting or warpage of the glass substrate layer.

Another object of the present invention is to increase the adhesion between the metal electrode layer and the glass substrate layer to a desired level when the metal electrode layer is formed on the glass substrate layer.

Technical Solution

A circuit board of the present invention for achieving this purpose may be configured to include a base layer, a seed layer, a first electrode layer, and so on.

The seed layer may be formed on the base layer.

The first electrode layer may be formed on the seed layer.

In the circuit board of the present invention, the base layer may be made of glass.

In the circuit board of the present invention, the seed layer may be made of a metal oxide.

In the circuit board of the present invention, the seed layer may be made of IZO.

In the circuit board of the present invention, the seed layer may be formed to have a thickness of 100 to 400 Å.

The circuit board of the present invention may include an insulation layer, a second electrode layer, a via, a passivation layer, a surface treatment layer, and so on.

The insulation layer may be formed on the first electrode layer.

The second electrode layer may be formed on the insulation layer.

The via may penetrate the insulation layer to connect the first electrode layer and the second electrode.

The passivation layer may be formed on the second electrode layer, the insulation layer, and the via while opening a part of the second electrode layer.

The surface treatment layer may be formed on the open surface of the second electrode layer.

In the circuit board of the present invention, the open surface of the second electrode layer on which the surface treatment layer is formed may act as an LED landing pad on which an LED is mounted.

In the circuit board of the present invention, the second electrode layer may include a common wire commonly connected to the LED landing pad and an individual wire individually connected to the LED landing pad.

In the circuit board of the present invention, the first electrode layer or the second electrode layer may include a dummy wire not connected to the LED landing pad.

Advantageous Effects

In the circuit board of the present invention, the seed layer is made of a metal oxide layer, for example, IZO, and the thickness thereof is limited to a range of 100 to 400 Å. Through this, the present invention can prevent lifting or warpage of the glass substrate layer, and further increase the adhesion between the metal electrode layer and the glass substrate layer to a desired level (5B).

DESCRIPTION OF DRAWINGS

FIG. 1 is a cross-sectional view showing a structure of a circuit board according to the present invention.

BEST MODE

Hereinafter, the present invention is described in more detail with reference to the accompanying drawings.

FIG. 1 is a cross-sectional view showing a structure of a circuit board according to the present invention.

As shown in FIG. 1, the circuit board of the present invention may include a base layer 110, a seed layer 120, a first electrode layer 130, an insulation layer 140, a second electrode layer 150, a via 160, a surface treatment layer 170, a passivation layer 180, and so on.

The base layer 110 is a substrate of the circuit board and may be made of a glass material. The base layer 110 may have a size of 1,100×1,250 mm. The base layer 110 may have a thickness in the range of 0.4 to 0.7 mm.

The seed layer 120 may be formed on the base layer 110. The first electrode layer 130 is formed on the seed layer 120, so that the first electrode layer 130 can be firmly coupled to the base layer 110. The seed layer 120 may have the same pattern as the first electrode layer 130.

The seed layer 120 may be made of a metal oxide. As the metal oxide, for example, indium zinc oxide (IZO), indium tin oxide (ITO), aluminum zinc oxide (AZO), zinc oxide ($ZnO_x$), titanium oxide ($TiO_2$), aluminum oxide ($Al_2O_3$), or the like may be used.

Table 1 below shows the measurement of glass warpage of the glass substrate layer 110 while changing the thickness of the seed layer 120 for the prior art (using titanium as a seed layer) and an example (using IZO as a seed layer). Here, the warpage of the glass substrate layer 110 was measured by measuring the lifting height of the glass substrate layer 110 in the vertex region of the glass substrate layer 110. If no warpage occurred, it was marked with ×.

TABLE 1

| Thickness of seed layer(Å) | Lifting height(mm) | |
|---|---|---|
| | Prior art(Ti) | Example(IZO) |
| 90 | × | × |
| 100 | × | × |
| 150 | × | × |
| 200 | × | × |
| 250 | × | × |
| 300 | × | × |
| 350 | × | × |
| 400 | × | × |
| 410 | 1.2 | 0.8 |
| 600 | 2.4 | 1.9 |
| 800 | 4.1 | 2.5 |
| 1000 | 5.3 | 3.3 |

Referring to Table 1 above, the glass warpage did not occur in the glass substrate layer 110 until the thickness of the seed layer reached 400 Å, in both the prior art (Ti) and the example (IZO). However, when the thickness of the seed layer 120 exceeds 400 Å, the increase in the lifting height showed slightly better results in the example (IZO) than in the prior art (Ti).

Table 2 below shows the measurement of adhesion while changing the thickness of the seed layer 120 for the prior art (using titanium as a seed layer) and an example (using IZO as a seed layer). Here, the adhesion was measured by a cross cut test. In the cross cut test, after cutting in the form of a grid, it was rubbed diagonally 5 times using a brush (shoe brush, etc.), and a tape was attached to the test surface and then peeled off. At this time, if there were no falling grid cells, it was indicated as 5B, 5% or less, 4B, more than 5% and 15% or less, 3B, more than 15% and 35% or less, 2B, and more than 35% and 65% or less, 1B.

TABLE 2

| Thickness of seed layer (Å) | Adhesion | |
|---|---|---|
| | Prior art(Ti) | Example(IZO) |
| 90 | 2B | 4B |
| 100 | 2B | 5B |
| 150 | 2B | 5B |
| 200 | 3B | 5B |
| 250 | 3B | 5B |
| 300 | 3B | 5B |
| 350 | 3B | 5B |
| 400 | 3B | 5B |
| 410 | 3B | 5B |
| 600 | 4B | 5B |
| 800 | 5B | 5B |
| 1000 | 5B | 5B |

Referring to Table 2 above, in the prior art (Ti), the adhesion reaches 5B only when the thickness of the seed layer 120 reaches 800 Å. However, in the case of the example (IZO), the adhesion reached 5B for the thickness of the seed layer 120 of 100 Å or more. As described above, it can be seen that the adhesion is quite good in the example (IZO) even if the thickness of the seed layer 120 is thin.

Combining the results of Tables 1 and 2 above, there was no significant difference between the prior art (Ti) and the example (IZO) in the glass warpage of the glass substrate layer 110, but in the adhesion, the example (IZO) showed significantly better results than the prior art (Ti). However, in order to have a technical meaning to apply the example (IZO), it is necessary to show good results in both glass warpage and adhesion of the glass substrate layer 110. Accordingly, when IZO is used as a seed layer in the present invention, it may be preferable to limit the thickness thereof to 100 to 400 Å.

In addition to the above experiments, the same experiments were performed for the seed layer 120 using ITO, and ITO also yielded similar results to IZO. Therefore, it is technically meaningful to use a metal oxide as the seed layer 120.

The seed layer 120 may be formed by a method of forming a circuit pattern, and for example, a photo process, a sputtering process, or the like may be used.

In the photo process, a metal oxide is formed on the base layer 110, a resist layer is formed thereon, and processes such as exposure, development, etching, and peeling of the resist layer may be performed.

In the sputtering process, sputtering may be performed with a metal oxide target in an inert atmosphere.

The first electrode layer 130 may be formed on the seed layer 120. The first electrode layer 130 may be formed by patterning a conductive metal. As the conductive metal, for example, silver (Ag), copper (Cu), gold (Au), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), etc. may be used.

The first electrode layer 130 may be configured in a mesh pattern to eliminate visibility.

The first electrode layer 130 is a conductive circuit layer and may be used for power supply, signal transmission, and the like.

The first electrode layer 130 may be connected vertically to the second electrode layer 150 to be described later and function as a common wire commonly connected to a plurality of components or as an individual wire individually connected to one component. A part of the first electrode layer 130 may be a dummy wire that is not connected to a power source or the like.

The first electrode layer 130 may be formed by utilizing a method of forming a circuit pattern, for example, a photo process, sputtering, plating process, or the like.

In the photo process, a metal is formed on the base layer 110, a resist layer is formed thereafter, and processes such as exposure, development, etching, and peeling of the resist layer may be performed.

The sputtering process may be performed with a conductive metal target in an inert atmosphere such as argon.

The plating process may be performed in an electrolytic or electroless manner using the seed layer 120 to perform plating.

The insulation layer 140 may be formed on the first electrode layer 130.

The insulation layer 140 insulates the first electrode layer 130 and the second electrode layer 150, and may be made of an insulating material, for example, a thermosetting or photocurable organic material such as an epoxy compound, an acrylic compound, or a melanin compound.

The second electrode layer 150 may be formed on the insulation layer 140.

The second electrode layer 150 may be formed by patterning a conductive metal. As the conductive metal, the same material as that of the first electrode layer 130, for example, silver (Ag), copper (Cu), gold (Au), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), etc. may be used.

Like the first electrode layer 130, the second electrode layer 150 may be configured in a mesh pattern in order to eliminate visibility.

Similar to the first electrode layer 130 described above, the second electrode layer 150 is a conductive circuit layer and may be used for power supply, signal transmission, and the like.

The second electrode layer 150 may be connected vertically to the first electrode layer 130 and function as a common wire commonly connected to a plurality of components or as an individual wire individually connected to one component. A part of the second electrode layer 150 may be a dummy wire that is not connected to a power source or the like.

As shown in FIG. 1, a part of the second electrode layer 150 is not closed by the passivation 180 to be described later, but is opened to the outside (even though the upper surface of the open part will be covered with the surface treatment layer 170 to be described later, it is described that an opening is formed with reference to the second electrode layer 150 here), and various mounting components such as a light emitting diode (not shown) may be coupled to the opening region. As such, the opening region of the second electrode layer 150 may function as a landing pad. Here, a plurality of the landing pad may be provided.

A common wire or an individual wire may be connected to the landing pad of the second electrode layer 150. The common wire may be commonly connected to a plurality of landing pads, and the individual wires may respectively be connected to a plurality of landing pads. For example, the common wire may be provided as a cathode wire of the circuit board, and the individual wire may be provided as an anode wire of the circuit board. Through this configuration, it is possible to individually control the light emitting diodes (LEDs) coupled to the landing pads.

The second electrode layer 150 may be formed by utilizing a method of forming a circuit pattern, for example, the photo process, sputtering, plating process, etc. described above.

The plating process may be performed in an electrolytic or electroless manner.

The via 160 may pass through the insulation layer 140 to connect the first electrode layer 130 and the second electrode layer 150, or connect the first electrode layer 130 to an external connection terminal.

The via 160 may be made of, like the first and second electrode layers 130 and 150, a conductive metal, for example, silver (Ag), copper (Cu), gold (Au), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), or the like.

The via 160 may be formed in the same process as the second electrode layer 150, and in this case, the second electrode layer 150 and the via 160 may be integrally formed.

The surface treatment layer 170 may be formed on the open surface of the second electrode layer 150.

The surface treatment layer 170 is formed to prevent corrosion of the open surface of the second electrode layer 150, and may be formed by sputtering gold (Au), tin (Sn), silver (Ag), nickel (Ni), copper (Cu), an organic compound (Organic Solderability Preservative: OSP), etc. on the second electrode layer 150.

The surface treatment layer 170 may preferably be formed only on the open surface of the second electrode layer 150. However, if it is easier to form over the entire surface of the second electrode layer 150 in the process, the surface treatment layer 170 may be formed on the entire surface of the second electrode layer 150. In this case, a part of the surface treatment layer 170 may be buried in the passivation layer 180.

The passivation layer 180 may be formed on the second electrode layer 150, the insulation layer 140, and the via 160 while partially opening the second electrode layer 150.

The passivation layer 180 insulates and protects the second electrode layer 150 and the like, and may be configured to open the surface treatment layer 170 connected to the circuit board. The passivation layer 180 may be formed of a general insulator, for example, at least one material selected from a curable prepolymer, a curable polymer, and a plastic polymer.

The passivation layer 180 may be formed of a varnish-type material that can be made into a film. The varnish-type material may include polysilicon-based materials such as polydimethylsiloxane (PDMS), polyorganosiloxane (POS), polyimide-based materials, or polyurethane-based materials such as spandex, etc. These varnish-type materials are flexible insulators, which can increase the stretchability of the touch sensor and increase the dynamic folding ability.

Although particular embodiments of the present invention have been shown and described, it will be understood by those skilled in the art that it is not intended to limit the present invention to the preferred embodiments, and it will be obvious to those skilled in the art that various changes and modifications may be made without departing from the spirit and scope of the invention.

The scope of the present invention, therefore, is to be defined by the appended claims and equivalents thereof.

DESCRIPTION OF REFERENCE NUMERALS

110: base layer
120: seed layer

130: first electrode layer
140: insulation layer
150: second electrode layer
160: via
170: surface treatment layer
180: passivation layer

The invention claimed is:

1. A circuit board, comprising:
a base layer, wherein the base layer is made of glass;
a seed layer formed on the base layer, wherein the seed layer is formed to have a thickness of 100 to 400 Å;
a first electrode layer formed on the seed layer;
an insulation layer formed on the first electrode layer;
a second electrode layer formed on the insulation layer;
a via penetrating the insulation layer to connect the first electrode layer and the second electrode;
a passivation layer formed on the second electrode layer, the insulation layer, and the via while opening a part of the second electrode layer; and
a surface treatment layer formed on the open surface of the second electrode layer,
wherein the second electrode layer and the via are integrally formed, and the via is directly connected to the first electrode layer without another seed layer while forming a depression space on a upper side of the via, and
wherein the depression space is filled with the passivation layer.

2. The circuit board of claim 1, wherein the seed layer is made of a metal oxide.

3. The circuit board of claim 2, wherein the seed layer is made of indium zinc oxide (IZO).

\* \* \* \* \*